(12) United States Patent
Mirin et al.

(10) Patent No.: US 9,209,013 B2
(45) Date of Patent: Dec. 8, 2015

(54) CONSTRUCTIONS COMPRISING THERMALLY CONDUCTIVE STACKS CONTAINING RUTILE-TYPE TITANIUM OXIDE

(71) Applicant: Micron Technology, Inc., Boise, ID (US)

(72) Inventors: Nik Mirin, Boise, ID (US); Tsai-Yu Huang, Boise, ID (US); Vishwanath Bhat, Boise, ID (US); Chris M. Carlson, Nampa, ID (US); Vassil N. Antonov, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 215 days.

(21) Appl. No.: 13/956,211

(22) Filed: Jul. 31, 2013

(65) Prior Publication Data
US 2013/0316153 A1 Nov. 28, 2013

Related U.S. Application Data
(62) Division of application No. 12/778,893, filed on May 12, 2010, now Pat. No. 8,518,486.

(51) Int. Cl.
| | |
|---|---|
| *H01L 21/02* | (2006.01) |
| *C23C 16/40* | (2006.01) |
| *C23C 16/455* | (2006.01) |
| *H01G 4/08* | (2006.01) |
| *H01G 4/12* | (2006.01) |
| *H01G 4/33* | (2006.01) |
| *H01L 27/108* | (2006.01) |

(Continued)

(52) U.S. Cl.
CPC .......... *H01L 21/02233* (2013.01); *C01G 23/04* (2013.01); *C23C 16/405* (2013.01); *C23C 16/45534* (2013.01); *H01G 4/085* (2013.01); *H01G 4/1227* (2013.01); *H01G 4/33* (2013.01); *H01L 21/02186* (2013.01); *H01L 21/02244* (2013.01); *H01L 23/3735* (2013.01); *H01L 27/10852* (2013.01); *H01L 28/40* (2013.01); *H01L 28/60* (2013.01); *H05K 1/0203* (2013.01); *H01L 2924/0002* (2013.01); *Y10T 428/24802* (2015.01); *Y10T 428/24975* (2015.01)

(58) Field of Classification Search
CPC ............... Y10T 428/24802; Y10T 428/24917; Y10T 428/24926; H01L 21/02186; H01L 23/3735
See application file for complete search history.

(56) References Cited

U.S. PATENT DOCUMENTS

| | | | |
|---|---|---|---|
| 6,114,200 | A | 9/2000 | Yew et al. |
| 6,155,198 | A | 12/2000 | Danek et al. |

(Continued)

OTHER PUBLICATIONS

Truman et al., "Formation of TiO2 Thin Films by Oxidation of TiN." Mat. Res. Soc. Symp. Proc. vol. 282. pp. 637-642.

*Primary Examiner* — Gerard Higgins
(74) *Attorney, Agent, or Firm* — Wells St. John P.S.

(57) ABSTRACT

Some embodiments include methods of forming rutile-type titanium oxide. A monolayer of titanium nitride may be formed. The monolayer of titanium nitride may then be oxidized at a temperature less than or equal to about 550° C. to convert it into a monolayer of rutile-type titanium oxide. Some embodiments include methods of forming capacitors that have rutile-type titanium oxide dielectric, and that have at least one electrode comprising titanium nitride. Some embodiments include thermally conductive stacks that contain titanium nitride and rutile-type titanium oxide, and some embodiments include methods of forming such stacks.

4 Claims, 8 Drawing Sheets

(51) Int. Cl.
  *H01L 49/02* (2006.01)
  *C01G 23/04* (2006.01)
  *H01L 23/373* (2006.01)
  *H05K 1/02* (2006.01)

(56) References Cited

U.S. PATENT DOCUMENTS

| | | |
|---|---|---|
| 6,156,606 A | 12/2000 | Michaelis |
| 6,573,547 B2 | 6/2003 | Ahn et al. |
| 6,673,668 B2 | 1/2004 | Kim et al. |
| 6,753,618 B2 | 6/2004 | Basceri et al. |
| 6,927,435 B2 | 8/2005 | Moriya et al. |
| 6,943,076 B2 | 9/2005 | Iwasaki et al. |
| 7,150,789 B2 | 12/2006 | Casovillo et al. |
| 7,271,077 B2 | 9/2007 | Marsh et al. |
| 7,378,354 B2 | 5/2008 | Sarigiannis et al. |
| 7,589,029 B2 | 9/2009 | Derderian et al. |
| 2004/0033688 A1 | 2/2004 | Sarigiannis et al. |
| 2004/0036051 A1 | 2/2004 | Sneh |
| 2004/0106261 A1 | 6/2004 | Huotari et al. |
| 2005/0224948 A1* | 10/2005 | Lee et al. ............... 257/686 |
| 2006/0251813 A1 | 11/2006 | Carlson et al. |
| 2007/0098902 A1 | 5/2007 | Engstrom et al. |
| 2009/0236581 A1 | 9/2009 | Yoshida et al. |

* cited by examiner

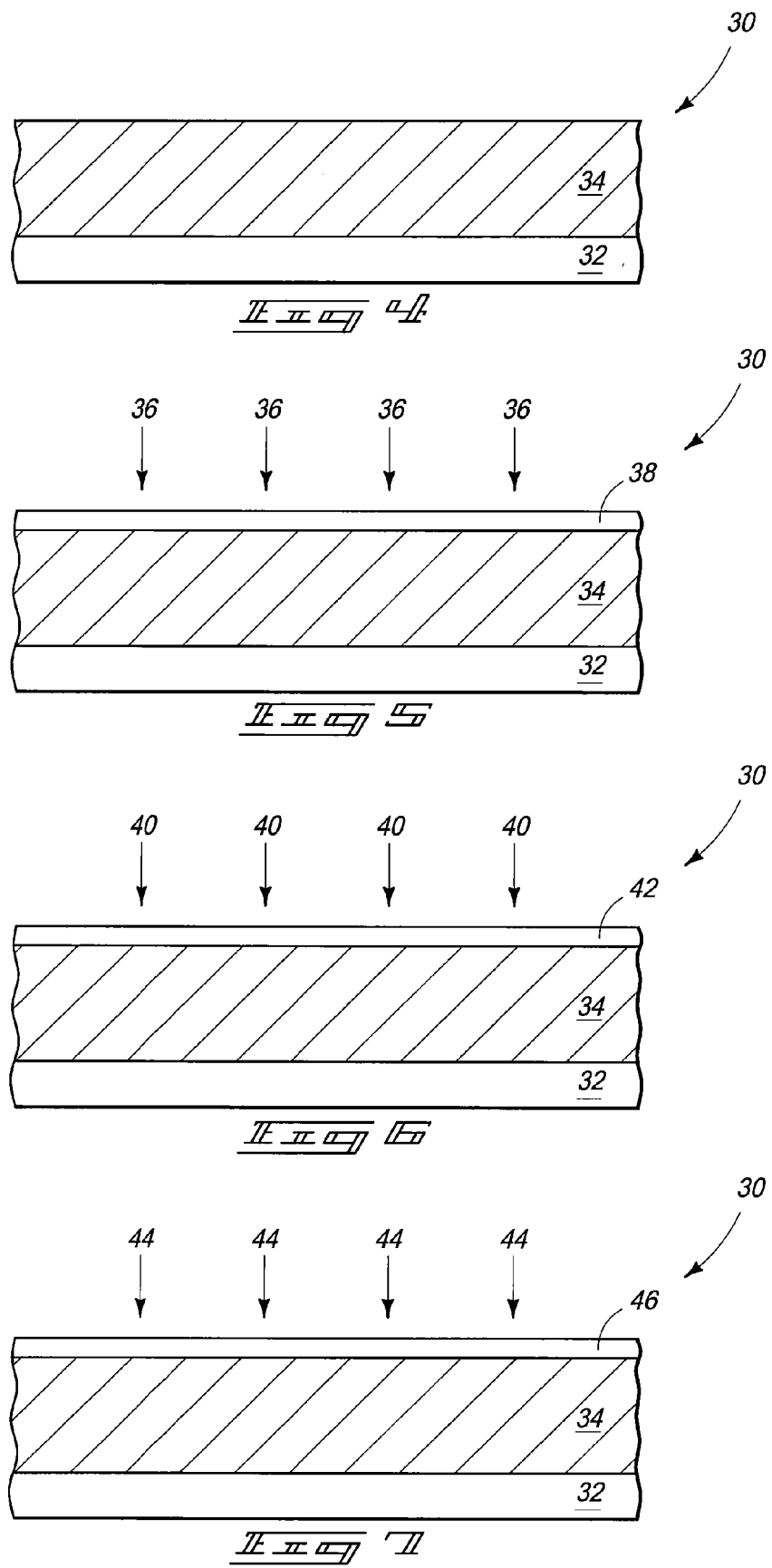

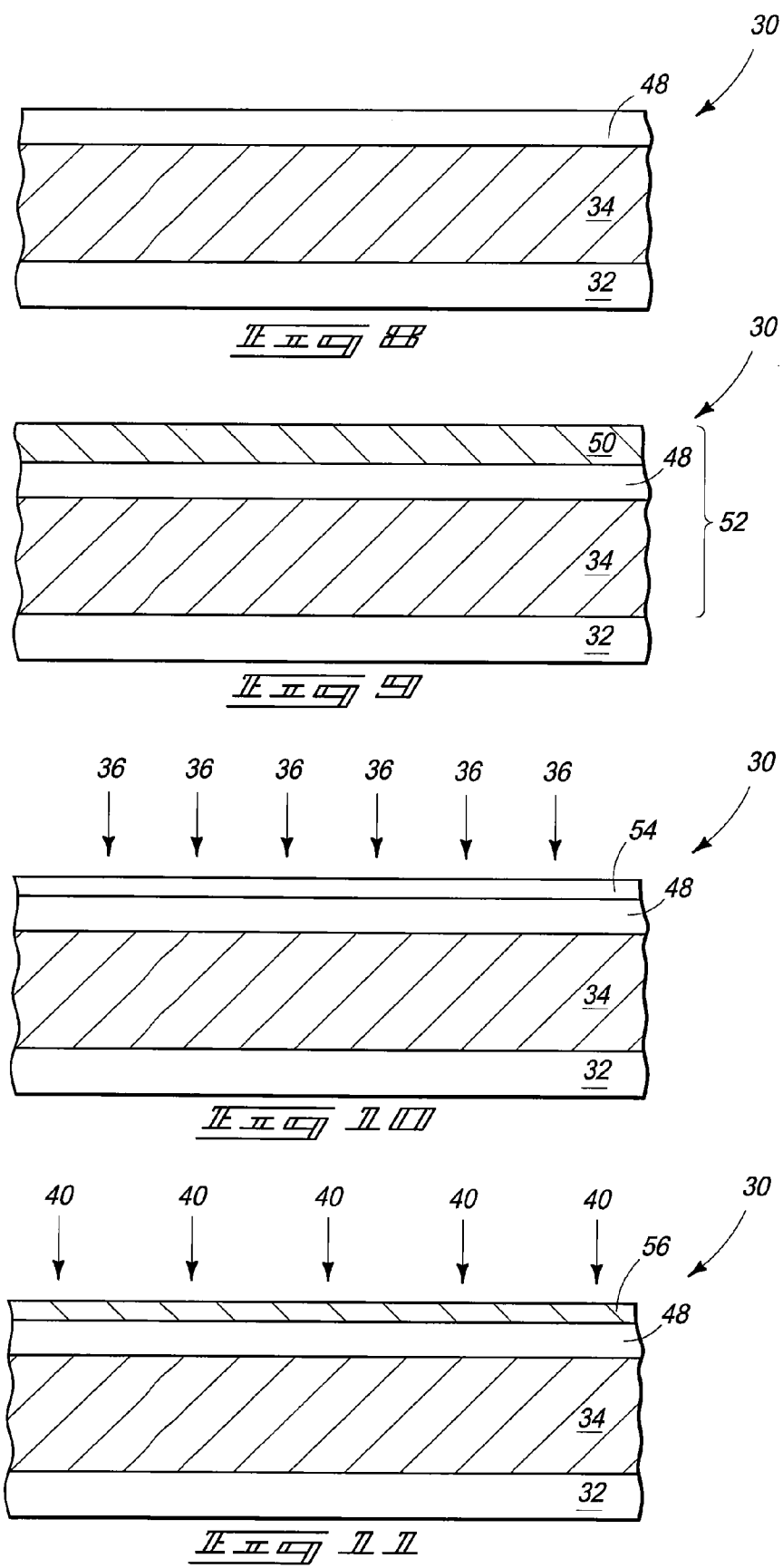

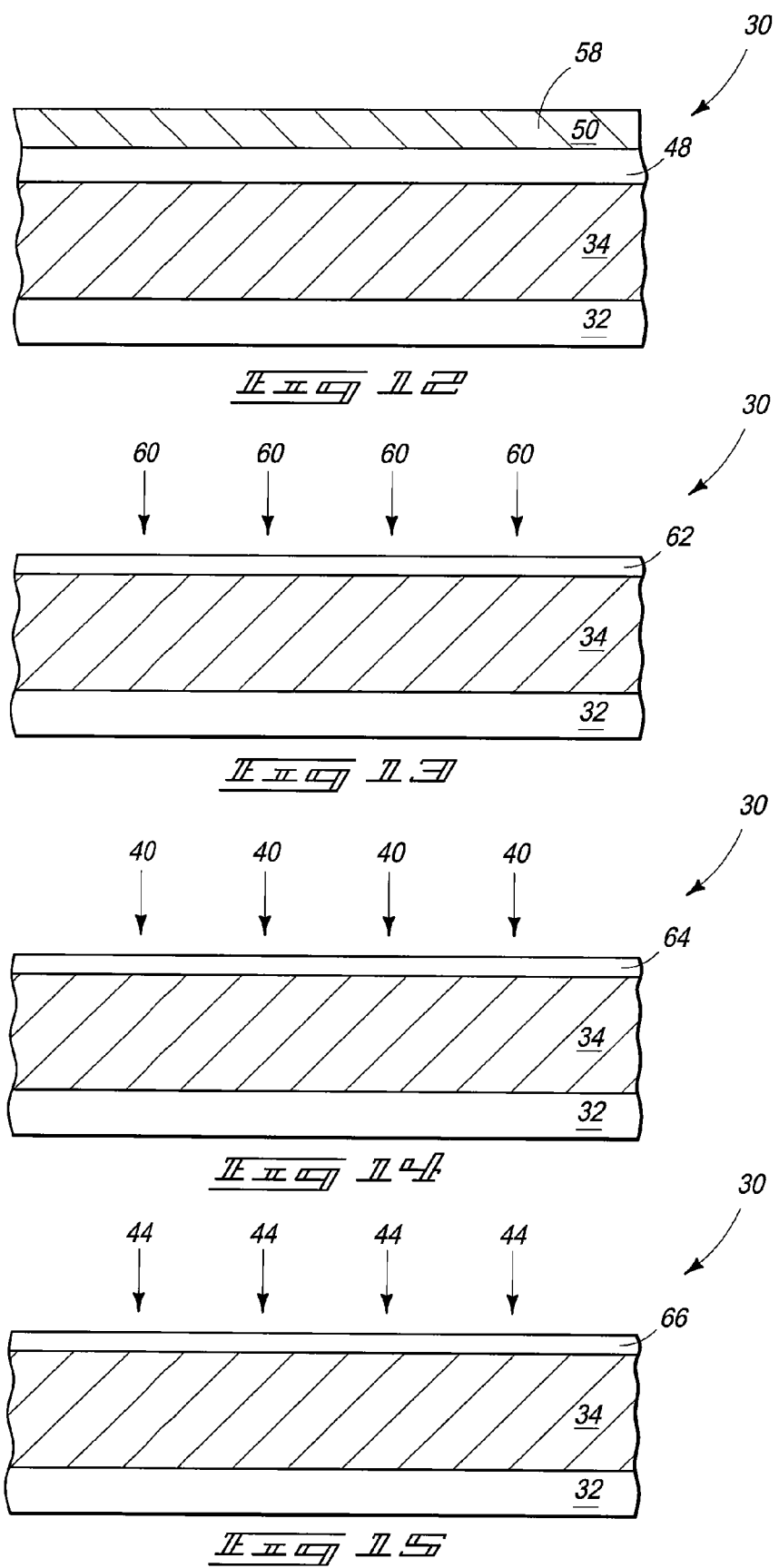

CONSTRUCTIONS COMPRISING THERMALLY CONDUCTIVE STACKS CONTAINING RUTILE-TYPE TITANIUM OXIDE

RELATED PATENT DATA

This patent resulted from a divisional of U.S. patent application Ser. No. 12/778,893, which was filed May 12, 2010, which is now U.S. Pat. No. 8,518,486, and which is hereby incorporated herein by reference.

TECHNICAL FIELD

Constructions comprising rutile-type titanium oxide; and methods of forming and utilizing rutile-type titanium oxide.

BACKGROUND

Titanium oxide may exist in a rutile crystal structure or an anatase crystal structure. The crystalline type of the titanium oxide may be established by the production method utilized to form the titanium oxide. Rutile-type titanium oxide is formed by deposition of the titanium oxide at temperatures of at least about 660° C., while anatase-type titanium oxide typically results from deposition processes maintained at or below temperatures of 465° C. Deposition processes having temperatures between 465° C. and 660° C. generally form mixtures of rutile-type titanium oxide and anatase-type titanium oxide. Some methods have been developed which form anatase-type titanium oxide at low deposition temperatures, and then utilize high temperature annealing to convert the anatase-type titanium oxide into rutile-type titanium oxide.

Rutile-type titanium oxide may be preferred over anatase-type titanium oxide in some applications because of the very high dielectric constant of the rutile-type titanium oxide (k>100). For instance, rutile-type titanium oxide may be preferred over anatase-type titanium oxide for utilization as capacitor dielectric material of integrated circuitry (for instance, as the capacitor dielectric material utilized in dynamic random access memory [DRAM]). Unfortunately, the high temperatures utilized in conventional methods of forming rutile-type titanium oxide may be damaging to various integrated circuit components. Accordingly, it can be difficult to incorporate rutile-type titanium oxide into integrated circuitry utilizing conventional methods of forming rutile-type titanium oxide.

For the above-discussed reasons, it would be desirable to develop new methods for forming rutile-type titanium oxide.

BRIEF DESCRIPTION OF THE DRAWINGS

FIGS. 4-9 are diagrammatic cross-sectional views of a construction shown at various process stages of an example embodiment method for forming and utilizing rutile-type titanium oxide.

FIGS. 10-12 are diagrammatic cross-sectional views of the construction of FIGS. 4-9 shown at various process stages of an example embodiment method for forming a top electrode of the construction.

FIGS. 13-15 are diagrammatic cross-sectional views of the construction of FIGS. 4-9 shown at various process stages of an alternative example embodiment method for forming rutile-type titanium oxide of the construction.

DETAILED DESCRIPTION OF THE ILLUSTRATED EMBODIMENTS

Figure 1:
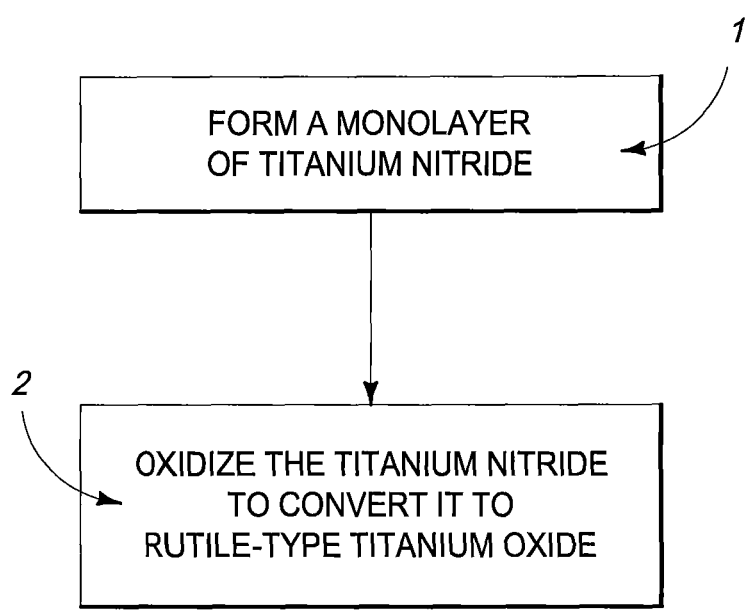
FIG. 1 is a flow chart diagram of an example embodiment method for forming rutile-type titanium oxide.

Some embodiments include methods of forming rutile-type titanium oxide at relatively low temperatures through atomic layer deposition (ALD). FIG. 1 shows a flow-chart diagram illustrating an example process for forming rutile-type titanium oxide. An initial step 1 comprises formation of a monolayer of titanium nitride, and a subsequent step 2 comprises conversion of such monolayer into rutile-type titanium oxide by exposing the monolayer to oxidant. It is found that the titanium nitride monolayer will convert to titanium oxide at temperatures of less than or equal to 550° C., which is much lower than the conventional temperatures utilized for forming rutile-type titanium oxide.

Figure 2:
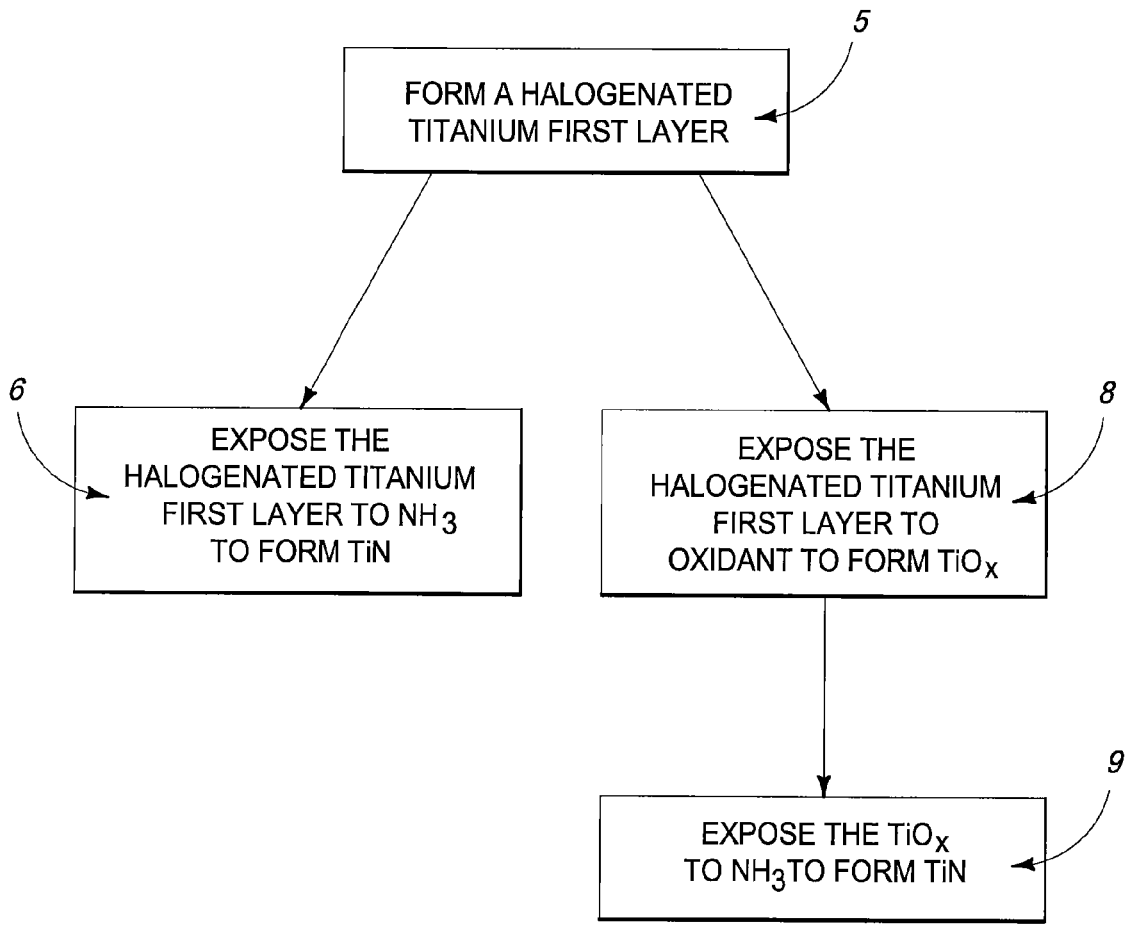
FIG. 2 is a flow chart diagram illustrating a couple of example embodiment pathways for forming a titanium nitride monolayer suitable for utilization in the FIG. 1 method.

The monolayer of titanium nitride may be formed with any suitable processing. FIG. 2 shows a flow-chart diagram illustrating a couple of example processes for forming the monolayer of titanium nitride. An initial step 5 comprises formation of a halogenated titanium first layer. Such first layer may be formed over a surface of a substrate by exposing the substrate to a titanium halide precursor. Such precursor may have the chemical formula TiX$_4$, where X is selected from the group consisting of fluorine, chlorine, bromine, iodine, and mixtures thereof. For instance, the precursor may have the chemical formula TiCl$_4$.

FIG. 2 shows two alternative pathways for converting the halogenated titanium first layer into the titanium nitride monolayer. One of the pathways is to simply expose the halogenated titanium first layer to ammonia (NH$_3$) to convert the halogenated titanium first layer into the titanium nitride monolayer. Such exposure is shown in FIG. 2 as step 6.

The other pathway comprises exposure of the halogenated titanium first layer to oxidant to convert the first layer into a titanium oxide (TiO$_x$) monolayer, as shown as step 8. The oxidant may be any suitable oxidant, including, for example, one or more of O$_2$, O$_3$ and water. The oxidant may or may not be incorporated in a plasma. In a specific example application, the oxidant may be non-plasma H$_2$O. The titanium oxide monolayer formed under such conditions will typically be anatase-type titanium oxide, or a mixture of anatase-type titanium oxide with rutile-type titanium oxide. In a subsequent step 9, the titanium oxide monolayer is exposed to ammonia to convert such monolayer into the titanium nitride (TiN) monolayer.

An advantage of the first pathway of FIG. 2 is that such comprises only a single step to transform the halogenated titanium first layer into the titanium nitride monolayer. However, a disadvantage may be that the conversion from halogenated titanium into titanium nitride may be incomplete so that some residual halogen remains in the titanium nitride. The advantage of the second pathway is that such pathway tends to be very good for completely converting the halogenated titanium first layer into a titanium nitride monolayer, but the disadvantage is that the second pathway utilizes two steps instead of one.

The various steps of FIGS. 1 and 2 are ALD steps, and comprise flowing precursors into a reaction chamber at different and substantially non-overlapping times relative to one another to form a desired material. For instance, step 5 of FIG. 2 comprises flowing titanium halide (i.e., $TiCl_4$) into a reaction chamber to form the halogenated titanium first layer, and step 6 comprising flowing ammonia into the reaction chamber at a different and substantially non-overlapping time relative to the titanium halide to convert the halogenated titanium first layer into the titanium nitride monolayer. If the titanium halide and ammonium precursors were flowed into the reaction chamber at an overlapping time with one another, the deposition process would be a chemical vapor deposition (CVD) process instead of an ALD process. The CVD process would form the titanium nitride to be thicker than a single monolayer, which would create complications for subsequent processing. Specifically, if the titanium nitride is significantly more than one monolayer thick at step 1 of FIG. 1, the subsequent conversion of the titanium nitride into titanium oxide at step 2 of FIG. 1 may lead to anatase-type titanium oxide at the low temperatures utilized in the embodiments discussed herein, and/or may lead to incomplete conversion of the titanium nitride into titanium oxide.

ALD processes occur when two precursors are in the reaction chamber at non-overlapping times with one another so that the precursors do not interact in gas phase with one another, but rather interact only at a substrate surface. In some embodiments, ALD processes may be described to comprise removal of substantially all of one precursor from within a reaction chamber prior to introducing another precursor into the reaction chamber. The term "substantially all" is utilized to indicate that an amount of precursor within the reaction chamber is reduced to a level where gas phase reactions with subsequent precursors (or reactant gases) do not degrade the properties of a material deposited on the substrate. Such can, in particular aspects, indicate that all of a first precursor is removed from the reaction chamber prior to introducing a second precursor, or that at least all measurable amounts of the first precursor are removed from the reaction chamber prior to introducing the second precursor into the chamber. The two precursors can then be considered to be present in the reaction chamber at different and substantially non-overlapping times relative to one another; with the term "substantially non-overlapping times" meaning that substantially all of one precursor is removed from within the reaction chamber prior to introduction of the next precursor.

Figure 3:
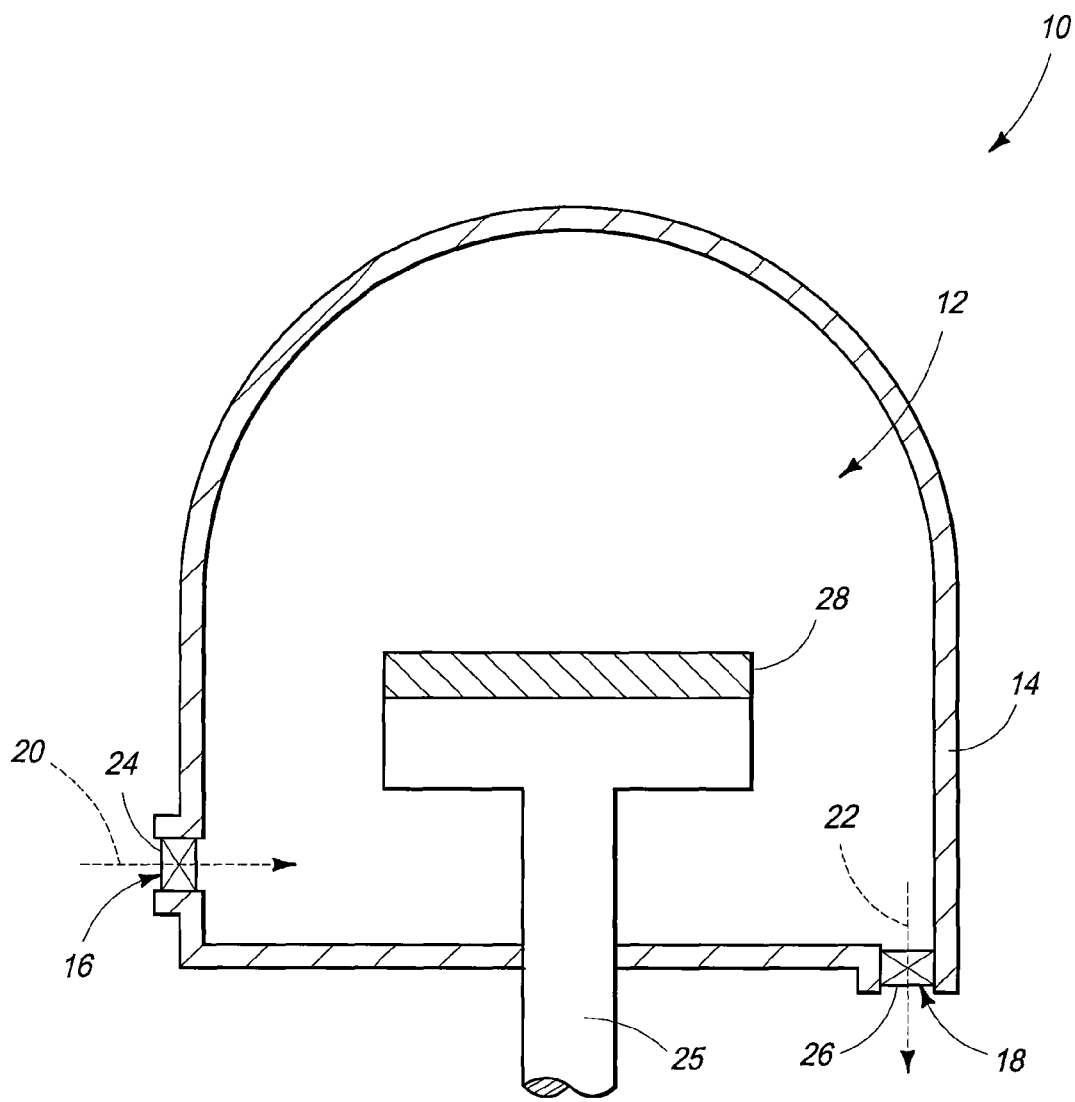
FIG. 3 is a diagrammatic cross-sectional view of an example reaction chamber that may be utilized in some example embodiments.

An example ALD apparatus 10 that may be utilized for the various steps of FIGS. 1 and 2 is illustrated in FIG. 3. Such apparatus has an ALD reaction chamber 12 therein.

The apparatus 10 has a sidewall 14 extending around the chamber. An inlet 16 extends through the sidewall 14 and into reaction chamber 12, and an outlet 18 also extends through the sidewall. In operation, reactants (i.e., precursors) are introduced into inlet 16 and flowed into reaction chamber 12 (as indicated by arrow 20), and materials are purged or otherwise exhausted from chamber 12 thorough outlet 18 (as indicated by arrow 22).

Valves 24 and 26 are shown across inlet 16 and outlet 18, and such can be utilized to control flow of materials into and out of the chamber 12. A pump (not shown) can be provided downstream from outlet 18 to assist in exhausting materials from within reaction chamber 12.

A substrate holder 25 is provided within the reaction chamber 12, and such supports a substrate 28. Substrate 28 can be, for example, a semiconductor substrate, such as, for example, a monocrystalline silicon wafer. In some embodiments the substrate holder may have temperature controlling equipment (not shown) associated therewith so that a temperature of the substrate may be maintained in a desired range through utilization of such equipment.

The apparatus 10 is shown schematically, and it is to be understood that other configurations can be utilized for ALD processes to accomplish non-overlapping flow of two or more precursors into a reaction chamber. Also, it is to be understood that additional materials can be flowed into the reaction chamber besides the precursors. For instance, an inert gas can be flowed into the reaction chamber together with precursor to assist in flowing the precursor into the reaction chamber.

In some embodiments, the apparatus 10 may be provided with coils (not shown) configured to control a temperature within chamber 12, and/or to maintain a plasma within the chamber.

In practice, a first precursor may be introduced into chamber 12 to form a monolayer of first material across an exposed surface of substrate 28. The first precursor may be then purged from within the chamber using one or both of inert purge gas and vacuum; and then a second precursor may be introduced into the chamber to convert the monolayer of first material into a monolayer of second material. The second precursor may be then purged from within the chamber. The sequences of flowing the precursors into the chamber at different and non-overlapping times relative to one another may be repeated through multiple iterations to form a deposited composition to a desired thickness. In some embodiments, a sequence may use more than two precursors. Regardless, the sequence can be repeated multiple times to form a deposited composition to a desired thickness.

Some example methods of forming rutile-type titanium oxide, and example applications for the rutile-type titanium oxide, are described with reference to FIGS. 4-19.

Referring to FIG. 4, a construction 30 comprises a first capacitor electrode 34 over a substrate 32. Substrate 32 may comprise monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although substrate 32 is shown to be homogenous, the substrate may comprise numerous layers in some embodiments. For instance, substrate 32 may correspond to a semiconductor substrate containing one or more layers associated with integrated circuit fabrication. In such embodiments, the layers may correspond to one or more of refractory metal layers, barrier layers, diffusion layers, insulator layers, etc.

The first capacitor electrode 34 comprises an electrically conductive composition; and may, for example, comprise one or more of various metals (for instance, tungsten, titanium, etc.), metal-containing compositions (for instance, metal silicide, metal nitride, etc.) and conductively-doped semiconductor materials (for instance, conductively-doped silicon, conductively-doped germanium, etc.). Although the first capacitor electrode is shown to be homogeneous, in other embodiments the first capacitor electrode may comprise two or more discrete layers.

Referring next to FIG. 5, construction 30 is exposed to titanium halide precursor 36 to form a halogenated titanium monolayer 38 over an exposed surface of first capacitor electrode 34. The titanium halide precursor may, for example, comprise, consist essentially of, or consist of $TiCl_4$; and in such embodiments the halogenated titanium monolayer 38 may, for example, comprise, consist essentially of, or consist of titanium and chlorine. The halogenated titanium monolayer 38 may be formed in an ALD reaction chamber, such as the chamber described above with reference to FIG. 3. The exposure to the titanium halide precursor may be conducted while a pressure within the reaction chamber is from about 0.5 Torr to about 5 Torr; and while construction 30 is at a temperature below about 550° C.

The halogenated titanium monolayer may be utilized to form titanium nitride through either of the two pathways described above with reference to FIG. 2. FIG. 6 illustrates a process utilizing the pathway where the halogenated titanium monolayer is exposed to ammonia, and FIGS. 13 and 14 illustrate a process utilizing the pathway where the halogenated titanium monolayer is first converted to titanium oxide, and then exposed to ammonia. The halogenated titanium monolayer 38 may be referred to as a first layer to distinguish it from other layers that are formed subsequently.

Referring to FIG. 6, construction 30 is exposed to ammonia 40. Such exposure converts halogenated titanium monolayer 38 (FIG. 5) into a titanium nitride monolayer 42. In some embodiments, monolayer 42 consists essentially of, or consists of titanium nitride. In other embodiments, there may be some detectable residual halogen remaining in the titanium nitride monolayer 42. The exposure to the ammonia 40 is conducted at a separate and non-overlapping time relative to the exposure to the titanium halide precursor 36 (FIG. 5), and may be conducted utilizing the ALD reaction chamber described above with reference to FIG. 3. The exposure to the ammonia may be conducted while a pressure within the reaction chamber is from about 0.5 Torr to about 5 Torr; and while construction 30 is at a temperature below about 550° C.

Referring to FIG. 7, construction 30 is exposed to oxidant 44 to convert titanium nitride monolayer 42 into rutile-type titanium oxide monolayer 46. The exposure to the oxidant 44 is conducted at a separate and non-overlapping time relative to the exposure to the ammonia 40 (FIG. 6), and may be conducted utilizing the ALD reaction chamber described above with reference to FIG. 3. The oxidant may comprise one or more of water, $O_2$ and $O_3$. In some embodiments, the oxidant may comprise $O_2$ plasma. The exposure to the oxidant may be conducted while a pressure within the reaction chamber is from about 0.5 Torr to about 5 Torr; and while construction 30 is at a temperature below about 550° C. (such as, for example, a temperature of from about 300° C. to about 550° C.).

In some embodiments, all of the titanium oxide within monolayer 46 is in rutile form, or least rutile form is the only detectable form within such titanium oxide. Accordingly, the titanium oxide within monolayer 46 consists of rutile-type titanium oxide. In some embodiments, monolayer 46 may consist essentially of, or consist of titanium oxide. In such embodiments, any halogen present in titanium nitride layer 42 (FIG. 6) is removed during the conversion of the titanium nitride layer into the titanium oxide layer 46. In other embodiments, there may be detectable residual halogen remaining within titanium oxide layer 46.

Each of the above-described steps of FIGS. 5-7 may be conducted while a temperature of construction 30 remains below about 550° C. Thus, the rutile-type titanium oxide layer 46 may be formed without exposure of construction 30 to the problematic high temperatures of prior art processes of forming rutile-type titanium oxide.

Referring to FIG. 8, construction 30 is shown after the steps of FIGS. 5-7 have been repeated through multiple iterations to form multiple titanium oxide monolayers on top of one another, and to thereby create a titanium oxide mass 48 over first electrode 34. The titanium oxide of mass 48 may consist of rutile-type titanium oxide. The mass 48 may have any desired thickness, and in some embodiments may have a thickness within a range of from 10 Å about 100 Å. The mass 48 is electrically insulative, and accordingly may be referred to as a dielectric mass.

Referring to FIG. 9, a second capacitor electrode 50 is formed over and directly against the dielectric mass 48. The second capacitor electrode may comprise any suitable composition; and may, for example, comprise one or more of various metals (for instance, tungsten, titanium, etc.), metal-containing compositions (for instance, metal silicide, metal nitride, etc.) and conductively-doped semiconductor materials (for instance, conductively-doped silicon, conductively-doped germanium, etc.). Although the second capacitor electrode is shown to be homogeneous, in other embodiments the second capacitor electrode may comprise two or more discrete layers.

Second capacitor electrode 50 is capacitively connected with first capacitor electrode 34 through the dielectric mass 48. Accordingly, the first and second capacitor electrodes 34 and 50, together with the dielectric mass 48, form a capacitor 52. The dielectric mass 48 can consist of rutile-type titanium oxide, and thus capacitor 52 can have the advantages associated with the high dielectric constant of rutile-type titanium oxide. Further, the rutile-type titanium oxide of mass 48 may be formed with the above-discussed ALD methodology utilizing relatively low temperature processing (i.e. the processing at temperatures of less than or equal to about 550° C.). Accordingly, the rutile-type titanium oxide may be formed without exposing construction 30 to the problematic high temperature processing utilized by prior art methods of forming rutile-type titanium oxide.

Although second capacitor electrode 50 may comprise any suitable composition, in some embodiments it may be advantageous for electrode 50 to comprise, consist essentially of, or consist of titanium nitride. Such titanium nitride may be formed utilizing the same chamber as is utilized for forming titanium oxide mass 48, utilizing the same ALD precursors as are utilized during formation of titanium nitride layer 42, which can simplify processing and increase throughput.

FIG. 10 shows construction 30 at a processing stage subsequent to that of FIG. 8, and specifically shows titanium halide precursor 36 be utilized to form a halogenated titanium monolayer 54 over mass 48.

FIG. 11 shows construction 30 exposed to ammonia 40 to convert layer 54 into a titanium nitride layer 56. The processing of FIGS. 10 and 11 may be repeated to form an electrically conductive mass containing multiple individual monolayers of titanium nitride. Such electrically conductive mass may be formed to any desired thickness. FIG. 12 shows construction 30 at a processing stage after multiple iterations of the processing of FIGS. 10 and 11, and shows the second capacitor electrode 50 corresponding to a mass 58 of titanium nitride. The shown processing of FIGS. 10 and 11 is ALD methodology, and thus comprises exposing construction 30 to the titanium halide precursor 36 at a separate and non-overlapping time relative to the ammonia 40. In other embodiments, the processing utilized to form the top electrode may be CVD processing, and thus may comprise exposing construction 30 to a gaseous mixture of the titanium halide precursor and the ammonia.

In some embodiments the first electrode 32 may comprise, consist essentially of, or consist of titanium nitride formed from titanium halide precursor and ammonia with processing similar to that discussed above with reference to FIGS. 11 and 12 for fabrication of the second capacitor electrode 50. Thus, the first capacitor electrode may be formed in a same reaction chamber as the dielectric mass 48 utilizing ALD or CVD processing. However, there may be some complications in forming the first capacitor electrode due to the first capacitor electrode often being patterned differently than the capacitor dielectric and the second capacitor electrode (as discussed in more detail below with reference to FIG. 16).

As discussed previously, the halogenated titanium monolayer 38 of FIG. 5 may be utilized to form titanium nitride through either of the two pathways described above with reference to FIG. 2. FIG. 6 illustrated a process utilizing the pathway where the halogenated titanium monolayer is exposed to ammonia, and FIGS. 13 and 14 illustrate a process utilizing the pathway where the halogenated titanium monolayer is first converted to titanium oxide, and then exposed to ammonia.

Referring to FIG. 13, construction 10 is illustrated at processing stage subsequent to that of FIG. 5, and specifically at a stage where the halogenated titanium monolayer 38 (FIG. 5) is exposed to oxidant 60 to convert it into a titanium oxide monolayer 62. The oxidant 60 may be the same as the oxidant utilized to convert titanium nitride into rutile-type titanium oxide, or may be different. In some embodiments, oxidant 60 comprises, consists essentially of, or consists of water.

The exposure to the oxidant 60 is conducted at a separate and non-overlapping time relative to the exposure to the titanium halide precursor 36 (FIG. 5), and may be conducted utilizing the ALD reaction chamber described above with reference to FIG. 3. The exposure to the oxidant 60 may be conducted while a pressure within the reaction chamber is from about 0.5 Torr to about 5 Torr; and while construction 30 is at a temperature below about 550° C.

Referring to FIG. 14, construction 30 is exposed to ammonia 40. Such exposure converts titanium oxide monolayer 62 (FIG. 5) into a titanium nitride monolayer 64. The exposure to the ammonia 40 is conducted at a separate and non-overlapping time relative to the exposure to the oxidant 60 (FIG. 13), and may be conducted utilizing the ALD reaction chamber described above with reference to FIG. 3. The exposure to the ammonia may be conducted while a pressure within the reaction chamber is from about 0.5 Torr to about 5 Torr; and while construction 30 is at a temperature below about 550° C.

In some embodiments, monolayer 64 consists essentially of, or consists of titanium nitride.

Referring to FIG. 15, construction 30 is exposed to oxidant 44 to convert titanium nitride monolayer 64 into rutile-type titanium oxide monolayer 66. The exposure to the oxidant 44 is conducted at a separate and non-overlapping time relative to the exposure to the ammonia 40 (FIG. 14), and may be conducted utilizing the ALD reaction chamber described above with reference to FIG. 3. The oxidant may comprise one or more of water, $O_2$ and $O_3$. In some embodiments, the oxidant may comprise $O_2$ plasma. The exposure to the oxidant may be conducted while a pressure within the reaction chamber is from about 0.5 Torr to about 5 Torr; and while construction 30 is at a temperature below about 550° C. (such as, for example, a temperature of from about 300° C. to about 550° C.).

In some embodiments, all of the titanium oxide within monolayer 66 is in rutile form, or least rutile form is the only detectable form within such titanium oxide. Accordingly, the titanium oxide within monolayer 66 consists of rutile-type titanium oxide.

The titanium oxide monolayers 62 and 66 may be referred to as first and second titanium oxide monolayers to distinguish them from one another. It may seem counterintuitive to form titanium oxide (layer 62), and then convert it to titanium nitride (layer 64), only to reform titanium oxide (layer 66) from the titanium nitride. However, as discussed above, such may be an efficient process for forming rutile-type titanium oxide having little, if any, detectable halogen therein.

The processing of FIGS. 13-15 may be repeated through multiple iterations to form multiple titanium oxide monolayers on top of one another, and to thereby create a titanium oxide mass having a desired thickness over first electrode 34 (analogously to the processing discussed above with reference to FIG. 8). A top capacitor electrode may then be formed over such mass to form a capacitor analogous to the capacitor 52 discussed above with reference to FIG. 9.

Figure 16:
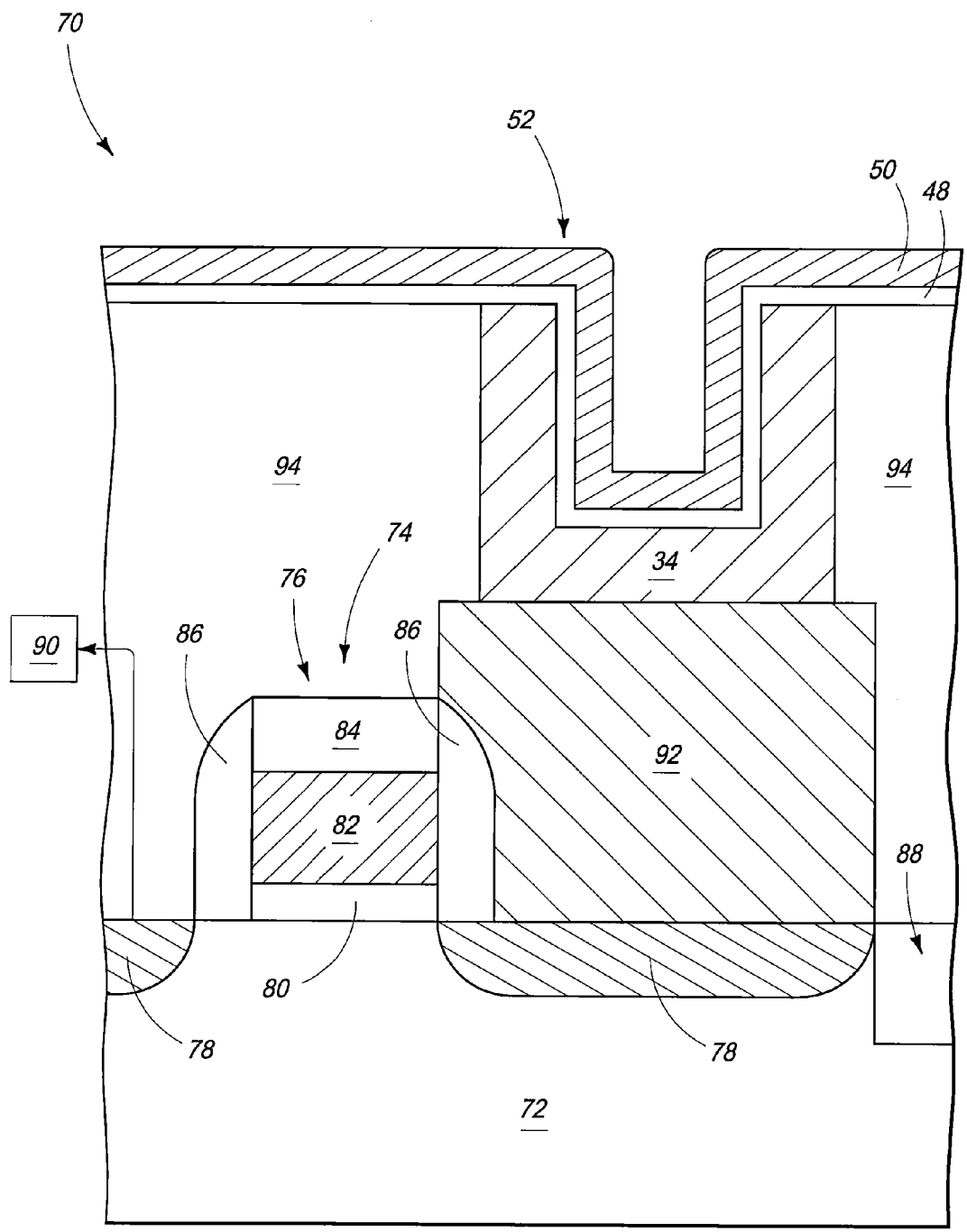
FIG. 16 is a diagrammatic cross-sectional view of an example DRAM unit cell incorporating rutile-type titanium oxide formed in accordance with an example embodiment.

The capacitors formed by the embodiments of FIGS. 1-15 may be incorporated into integrated circuitry. For instance, FIG. 16 shows a construction 70 comprising a DRAM unit cell that incorporates a capacitor formed in accordance with the embodiments discussed above. Similar numbering will be used to describe the construction 70 as is used above, where appropriate.

Construction 70 comprises a base 72. Such base may, for example, comprise, consist essentially of, or consist of monocrystalline silicon lightly doped with appropriate background dopant.

A transistor 74 is supported by base 72. Such transistor comprises a gate stack 76 over base 72, and comprises source/drain regions 78 extending into base 72. The gate stack includes a gate dielectric 80, an electrically conductive material 82, and an electrically insulative cap 84. The gate dielectric 80, electrically conductive material 82, and electrically insulative cap 84 may comprise any suitable materials. The source/drain regions 78 are shown to be dopant implant regions extending into base 72, and may comprise any suitable dopants.

Sidewall spacers 86 are along sidewalls of the gate stack 76, and may comprise any suitable electrically insulative materials.

An isolation region 88 extends into base 72 adjacent one of the source/drain regions 78. Such isolation region may be utilized to electrically isolate transistor 74 from other circuitry (not shown) and may comprise any suitable electrically insulative materials.

One of the source/drain regions 78 is shown to be connected to a bit line 90. The other of the source/drain regions 78 is shown to be electrically connected through an electrically conductive pedestal 92 to a capacitor 52. The electrically conductive pedestal may comprise any suitable electrically conductive materials, and may be omitted in some embodiments.

The capacitor 52 comprises the first capacitor electrode 34, dielectric mass 48 and second capacitor electrode 50 discussed above with reference to FIG. 9 (in other embodiments, the capacitor may comprise the dielectric mass 66 discussed above with reference to FIG. 15). The first capacitor electrode 34 is shown to be container-shaped. The dielectric mass 48 and second capacitor 50 are shown to extend over and within the container shape of the first capacitor electrode. The dielectric mass 48 and second electrode 50 have the same pattern as one another, and thus it may be advantageous to form the dielectric mass 48 and second electrode 50 in a common chamber in an uninterrupted process (i.e., without removing construction 70 from the chamber from a time that the fabrication of the dielectric mass is started until a time that the fabrication of the second electrode has completed). In contrast, the first electrode 34 is patterned differently than the dielectric mass 48, and thus it would be difficult to form first electrode 34 and mass 48 in a common chamber in an uninterrupted process.

An electrically insulative material 94 is provided over transistor 74 and along outer sides of first capacitor electrode 34. The insulative material 94 may electrically isolate various of the shown circuit components of construction 70 from other circuit components (not shown). Material 94 may comprise any suitable electrically insulative materials.

The transistor 76 and capacitor 52 may be considered to be together comprised by a DRAM unit cell. In some embodiments, a large number of such unit cells may be simultaneously fabricated across a semiconductor substrate to form a DRAM array.

The rutile-type titanium oxide formed by the embodiments of FIGS. 1-15 may have any of numerous applications besides applications as capacitor dielectric. For instance, the rutile-type titanium oxide may be utilized as gate dielectric material of transistor devices.

Another application for the various materials formed by the processing of FIGS. 1-15 is described with reference to FIGS. 17-19.

Figure 17:
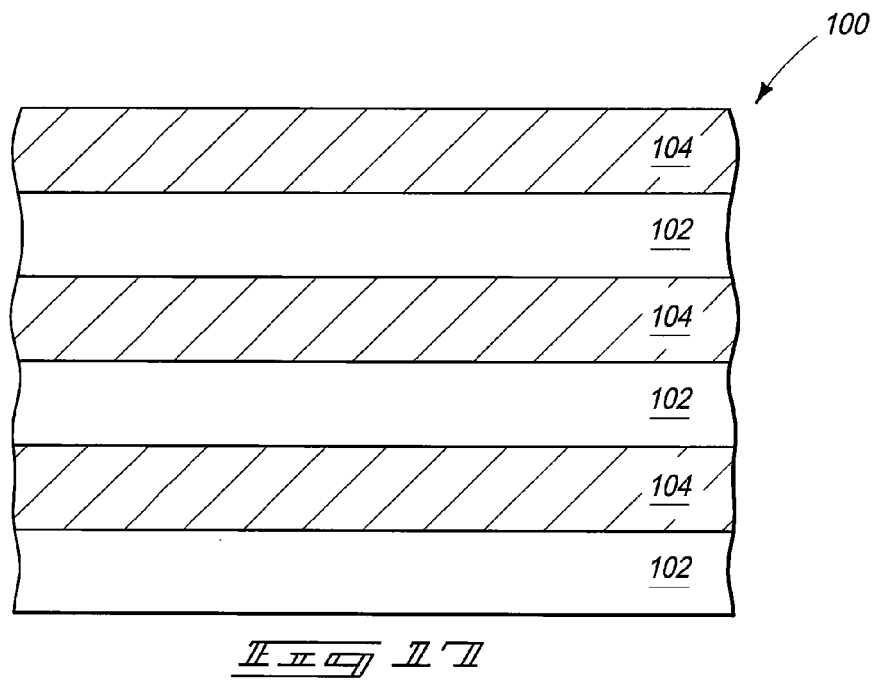
FIG. 17 is a diagrammatic cross-sectional view of an example thermally conductive TiN/TiO$_2$ stack incorporating rutile-type titanium oxide formed in accordance with an example embodiment.

Referring to FIG. 17, a construction 100 is shown to comprise a plurality of alternating regions 102 and 104. The regions 102 may consist of, or consist essentially of, rutile-type titanium oxide formed in accordance with one or more of the ALD processes described above with reference to FIGS. 1-9 and 13-15; and the regions 104 may consist of, or consist essentially of titanium nitride. Such titanium nitride may be formed in accordance with one or more of the ALD processes of FIG. 2 and FIGS. 10-12; and/or may be formed by a CVD process.

The regions 102 and 104 may be formed to any suitable thicknesses. In some embodiments, each of the regions 102 and 104 may be at least about 50 Å thick. Some of the regions may be thicker than others, or all of the regions may be about the same thickness as one another (as shown). There may be any suitable number of regions 102 and 104. In some embodiments, there may be a single region 102 and a single region 104. In other embodiments, there may be two or more regions 102, and two or more regions 104.

The construction 100 may be thermally conductive, and may be utilized for transporting thermal energy relative to integrated circuitry. FIGS. 18 and 19 illustrate example applications for construction 100.

Figure 18:
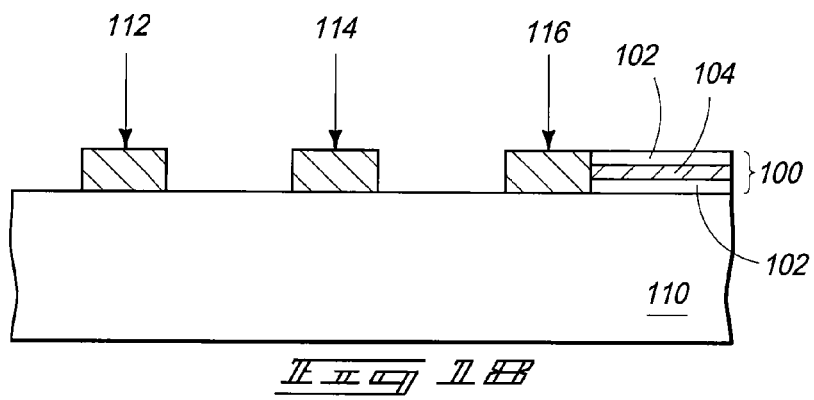
FIG. 18 is a diagrammatic cross-sectional view of a semiconductor construction illustrating an example use for the thermally conductive TiN/TiO$_2$ stack of FIG. 17.

Referring to FIG. 18, a semiconductor substrate 110 is shown supporting a plurality of integrated circuit components 112, 114 and 116. The integrated circuit components may correspond to, for example, transistor gates, non-volatile memory, DRAM unit cells, wiring, etc. Construction 100 is provided over the semiconductor substrate and proximate the integrated circuit component 116, and may be utilized for conducting thermal energy (i.e., heat) to or from such component. Although only one construction 100 is illustrated, in other embodiments multiple constructions can be provided to transport thermal energy to or from multiple integrated circuit components.

Figure 19:
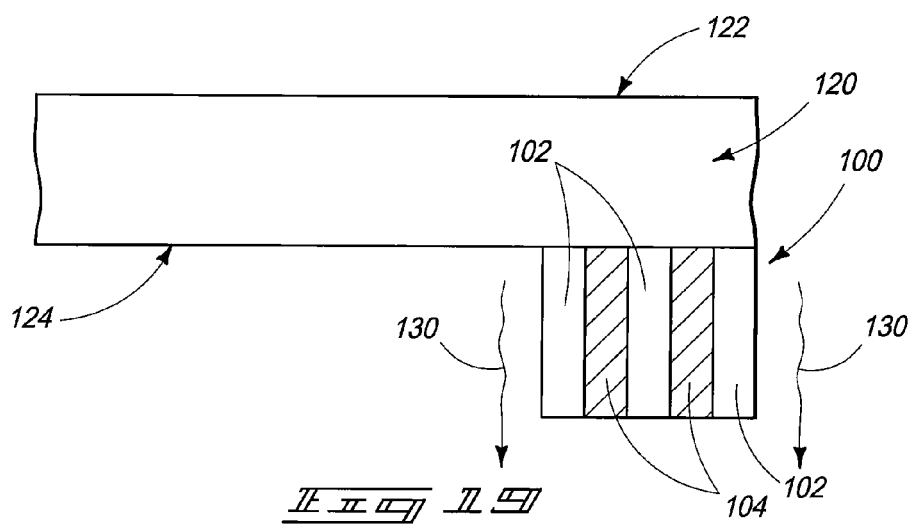
FIG. 19 is a diagrammatic cross-sectional view of another semiconductor construction illustrating another example use for the thermally conductive TiN/TiO$_2$ stack of FIG. 17.

Referring to FIG. 19, a semiconductor die 120 is shown to comprise a front side surface 122 and a back side surface 124. Typically, integrated circuitry (not shown) would be associated with the front side surface. Construction 100 is shown to be provided against the back side surface 124, and utilized for conducting heat away from the die (with the heat being diagrammatically illustrated with arrows 130). The various structures shown in FIG. 19 are not to scale, and typically construction 100 would be much smaller in relation to die 120 than is shown.

In some embodiments construction 100 could be provided against the front side surface 122 of the die in addition to, or alternatively to, providing construction 100 against the back side of the die. In yet other embodiments, multiple constructions 100 could be provided, and such constructions could be against the front side surfaces and/or back side surfaces of the die.

The embodiments discussed above with reference to FIGS. 1-19 may be utilized in electronic systems, such as, for example, computers, cars, airplanes, clocks, cellular phones, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A construction comprising:
    a semiconductor die comprising integrated circuitry on a front side surface of the die;
    a thermally conductive stack on the semiconductor die; the thermally conductive stack comprising two or more titanium nitride regions in alternating relationship with two or more titanium oxide regions; the titanium oxide within the titanium oxide regions consisting of rutile-type titanium oxide, wherein the thermally conductive stack is on the front side surface of the semiconductor die, wherein an electrically conductive component of the integrated circuitry has a lateral surface extending away from the front side surface of the semiconductor die, wherein the thermally conductive stack has an edge comprising surfaces of the titanium nitride regions and the titanium oxide regions, wherein the entirety of the edge of the thermally conductive stack directly contacts the lateral surface of the electrically conductive component; and wherein the thermally conductive stack is capable of conducting heat away from the integrated circuitry.

2. The construction of claim 1 wherein the titanium nitride regions are at least 50 Å thick, and wherein the titanium oxide regions are at least 50 Å thick.

3. A construction comprising:
    a semiconductor die comprising integrated circuitry on a front side surface of the die;
    a thermally conductive stack on the semiconductor die; the thermally conductive stack comprising two or more titanium nitride regions in alternating relationship with two or more titanium oxide regions; the titanium oxide within the titanium oxide regions consisting of rutile-type titanium oxide, wherein the semiconductor die has a back side surface in opposing relation to the front side surface, wherein the thermally conductive stack is on the back side surface of the semiconductor die, wherein the thermally conductive stack has an edge comprising surfaces of the titanium nitride regions and the titanium oxide regions, wherein the entirety of the edge of the thermally conductive stack directly contacts the back side surface of the semiconductor die; and wherein the thermally conductive stack is capable of conducting heat away from the semiconductor die.

4. The construction of claim 3 wherein the titanium nitride regions are at least 50 Å thick, and wherein the titanium oxide regions are at least 50 Å thick.

* * * * *